US006083376A

United States Patent [19]
Akram et al.

[11] Patent Number: 6,083,376
[45] Date of Patent: *Jul. 4, 2000

[54] ROTATING SYSTEM FOR ELECTROCHEMICAL TREATMENT OF SEMICONDUCTOR WAFERS

[75] Inventors: Salman Akram; David R. Hembree, both of Boise, Id.

[73] Assignee: Micron Technology, Inc., Boise, Id.

[*] Notice: This patent is subject to a terminal disclaimer.

[21] Appl. No.: 09/363,258

[22] Filed: Jul. 28, 1999

Related U.S. Application Data

[63] Continuation of application No. 08/901,921, Jul. 28, 1997, Pat. No. 6,635,548.

[51] Int. Cl.[7] .............................. C25D 5/00; C25D 7/12; C25D 17/00; C25B 9/00; C25B 11/00
[52] U.S. Cl. .................... 205/143; 205/157; 205/334; 205/656; 205/686; 205/687; 204/212; 204/225; 204/269; 204/284; 204/471
[58] Field of Search ................................ 204/212, 225, 204/269, 284, 471, 199, 272; 205/686, 687, 656, 137, 143, 157, 123, 334

[56] References Cited

U.S. PATENT DOCUMENTS

| | | |
|---|---|---|
| 3,714,011 | 1/1973 | Grosso et al. . |
| 3,798,056 | 3/1974 | Okinaka et al. .................... 204/212 |
| 3,915,832 | 10/1975 | Rackus et al. .................. 204/199 X |
| 4,304,641 | 12/1981 | Grandia et al. . |
| 4,592,816 | 6/1986 | Emmons et al. . |
| 4,696,729 | 9/1987 | Santini . |
| 4,855,020 | 8/1989 | Sirbola ................................. 205/137 |
| 5,096,550 | 3/1992 | Mayer et al. . |
| 5,198,089 | 3/1993 | Brueggman . |
| 5,273,642 | 12/1993 | Crites et al. . |
| 5,403,458 | 4/1995 | Hartig et al. . |
| 5,421,987 | 6/1995 | Tzanavaras et al. . |
| 5,437,777 | 8/1995 | Kishi . |
| 5,441,629 | 8/1995 | Kosaki . |
| 5,447,615 | 9/1995 | Ishida . |
| 5,472,592 | 12/1995 | Lowery ................................ 205/137 |
| 5,516,412 | 5/1996 | Andricacos et al. . |
| 5,788,820 | 8/1998 | Liu ..................................... 204/212 |

*Primary Examiner*—Donald R. Valentine
*Attorney, Agent, or Firm*—Trask, Britt & Rossa

[57] ABSTRACT

An electrochemical reaction assembly and methods of inducing electrochemical reactions, such as for deposition of materials on semiconductor substrates. The assembly and method achieve a highly uniform thickness and composition of deposition material or uniform etching or polishing on the semiconductor substrates by retaining the semiconductor substrates on a cathode immersed in an appropriate reaction solution wherein a wire mesh anode rotates about the continuous moving cathode during electrochemical reaction.

53 Claims, 8 Drawing Sheets

ROTATING SYSTEM FOR ELECTROCHEMICAL TREATMENT OF SEMICONDUCTOR WAFERS

Cross Reference to Related Application

This application is a continuation of application Ser. No. 08/901,921, filed Jul. 28, 1997, now U.S. Pat. No. 6,033,548.

BACKGROUND OF THE INVENTION

1. Field of the Invention

The present invention relates to an apparatus and method for inducing an electrochemical reaction on an article. More particularly, the present invention relates to electrodepositing material on semiconductor components by attaching the semiconductor components on a cathode immersed in an appropriate electrolyte wherein a wire mesh anode rotates about the cathode during electrodeposition.

2. State of the Art

Semiconductor wafers, substrates, and printed circuit boards (collectively hereinafter "semiconductor substrates") are often coated with various materials, such as metals which are etched in later semiconductor fabrication processes to form components on the semiconductor substrates. Techniques for coating semiconductor substrates include electrodeposition, electron beam evaporator deposition, chemical vapor deposition, sputter deposition, and the like. Electrodeposition has become a commonly used technology.

Figure 10:
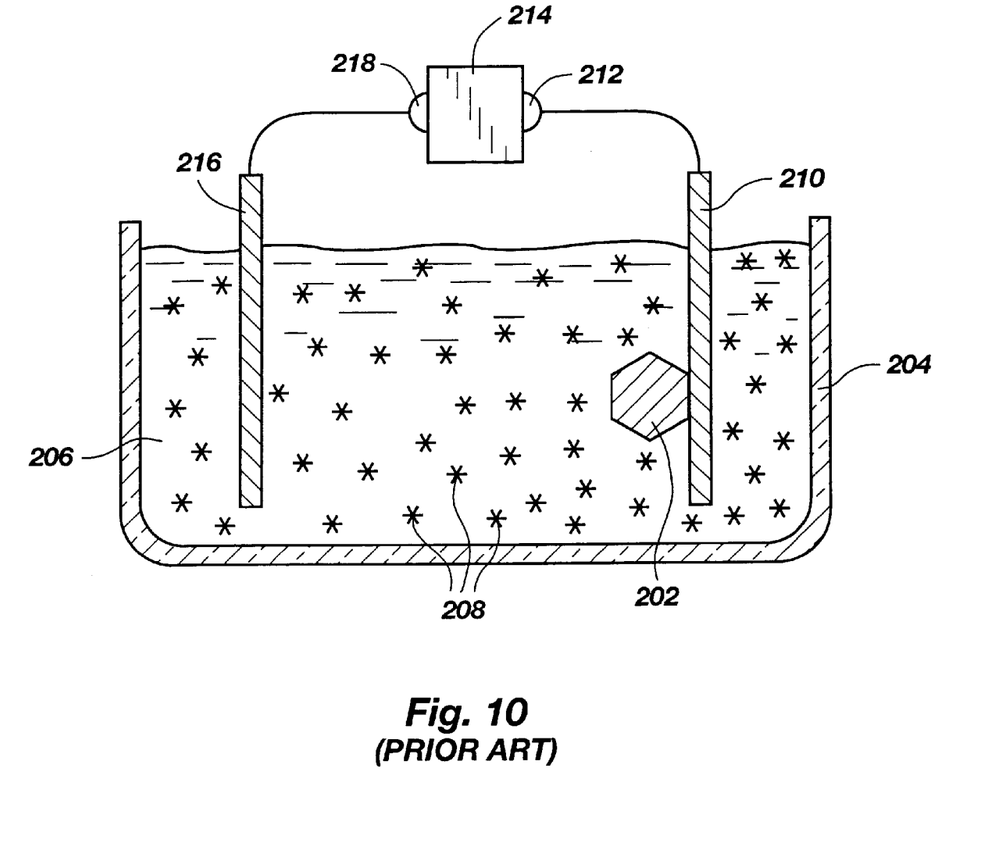
FIG. 10 is a prior art electrodeposition apparatus.

Electrodeposition is a process which deposits a thin film of material, such as metal or metal alloy, on an article. In electrodeposition, as shown in prior art FIG. 10, an article 202 is placed in a tank 204 containing an appropriate deposition solution, such as electrolyte solution 206, which contains ions 208 of the metal to be deposited on the article 202. The article 202 forms a cathode or is in electrical contact with a cathode 210 which is immersed in the electrolyte solution 206. The cathode 210 is connected to a negative terminal 212 of a power supply 214. A suitable anode 216 is also immersed in the electrolyte solution 206 at an appropriate distance from the cathode 210 and is connected to a positive terminal 218 of the power supply 214. The power supply 214 generates an electrical current which flows between the anode 216 and the cathode 210 through the electrolyte solution 206. The electrical current causes an electrochemical reaction at the surface of the article 202 which results in the metal ions 208 in the electrolyte solution 206 being deposited on the article 202.

With semiconductor components, it is desirable to deposit the metal film with a uniform thickness across the article and with uniformity of composition of the metal(s) and/or other compounds forming the metal film. However, the electrodeposition process is relatively complex and various naturally occurring forces may result in a degradation in the electrodeposition process. The electrical current or flux path between the anode and the cathode should be uniform without undesirable spreading or curving to ensure uniform deposition. Additionally, since the metal ions in the deposition solution are deposited on the article, the deposition solution becomes depleted of metal ions which degrades the electrodeposition process. Therefore, suitable controls are required to introduce metal ions into the deposition solution in order to maintain consistency.

U.S. Pat. No. 5,516,412 issued May 14, 1996 to Andricacos et al. (the '412 patent) relates to an electrodeposition cell having a rack for vertically supporting a silicon substrate to be electrodeposited. A paddle is disposed within the electrodeposition cell for agitating an electrolyte solution within the cell to maintain a uniform distribution of deposition material within the electrolyte solution. Furthermore, the '412 patent teaches that the rack can be designed to be removable for automated handling. Although the '412 patent addresses the control issues discussed above, the rack assembly disclosed is not conducive to high-volume manufacturing. Furthermore, the '412 patent does not teach or suggest any means for improving the deposition on the silicon substrate by the movement of either the anode or cathode.

U.S. Pat. No. 4,696,729 issued Sep. 29, 1987 to Santini and U.S. Pat. No. 5,198,089 issued Mar. 30, 1993 to Brueggman both relate to an electrodeposition cell having a cathode assembly which is vertically mounted and holds a plurality of semiconductor substrates to be coated, and an anode which is also vertically mounted adjacent to the cathode assembly. The deposition solution is pumped upward between the anode and the cathode to produce a laminar flow across the surface of each wafer. However, both patents lack a means for insuring uniform distribution of deposition material within the deposition solution.

Systems which can be used for electrodeposition can also be used for electropolishing and electroetching. For example, U.S. Pat. No. 5,096,550 issued Mar. 17, 1992 to Mayer et al. (the '550 patent) teaches attaching an article to a rotating anode positioned horizontally face down in a polishing or etching bath. However, the '550 patent teaches only the motion of the cathode and since the articles are attached one at a time in the anode, the apparatus of the '550 patent is not conducive to high-volume manufacturing.

In most electrodeposition techniques, the wafers are attached to the cathode. The attachment of the wafers to the cathode can lead to significant problems, especially as the wafer quantities are increased within a single batch, wherein control of the thickness of the material on the wafer becomes a problem. The problem of material thickness control is brought about by the non-uniformity of metal ions and less uniform current density in the electrolyte solution.

It is desirable to provide highly uniform thickness and composition of deposition material on an electrodeposited article or to uniformly polish or etch an article. Furthermore, it is also desirable to do so in an apparatus capable of high-volume manufacturing, preferably using automated handling equipment.

SUMMARY OF THE INVENTION

The apparatus of the present invention may comprise a housing tank containing a reaction solution, such as a deposition solution (e.g., an electrolyte solution). A cathode is disposed within a hollow anode which are both immersed in the reaction solution. The hollow anode is in electrical communication with a positive terminal of a power supply. The cathode is in electrical communication with a negative terminal of the power supply. The hollow anode is preferably a rotatable wire mesh cylinder which is rotated by a variable speed and direction motor. The wire mesh allows the reaction solution to flow through the anode. The rotation of the hollow anode agitates and mixes the reaction solution to maintain a uniform distribution of deposition material, etching material, or polishing material within the reaction solution. It is, of course, understood that the hollow anode can be any perforated metal structure, such as a thin sheet of metal with a plurality of holes drilled therethrough. The rotation also prevents any dead spots on the anode from affecting the uniformity. Dead spots are considered as points where a complete electrical path between the anode and the cathode is not possible due to contamination or other imperfection on the anode.

The cathode is preferably an elongate structure with at least one surface for mounting at least one semiconductor substrate. The cathode can be of any cross-sectional shape, such as planar, triangular, rectangular, pentagonal, hexagonal, and so on, such that each shape edge forms a surface for mounting the semiconductor substrates. The cross-sectional shape of the cathode is related to the size of the electrodeposition apparatus (i.e., the size of the hollow anode). The cathode surfaces may include a plurality of article retainers, such as clips, for mounting the semiconductor substrates to the cathode.

The cathode may be connected to an automated immersion mechanism. The automated immersion mechanism inserts and extracts the cathode into and from the hollow anode. Additionally, the automated immersion mechanism may be arranged in a carousel arrangement such that multiple individual cathodes are attached to said carousel. Thus, the automated immersion mechanism can facilitate a high-volume manufacturing.

The cathode of the present invention may also be stationary wherein removable plates having the semiconductor substrates mounted thereto are slid into plate retainers on the cathode surface. Thus, the removable plates can be automatically inserted and removed in turn after the requisite amount of deposition time. Such a cathode configuration minimizes spillage, contamination, and disturbance to the system.

It is, of course, understood that the cathode could be hollow with the anode disposed therein. The semiconductor substrates are attached to the cathode and the anode rotates within the hollow cathode.

The apparatus of the present invention is particularly effective in forming conductive traces on carrier substrates, such as gold plated substrates such as FR-4 boards (e.g., SIMM boards) where uniformity is a severe problem. The present invention achieves uniform deposition without requiring an additional process step of depositing a soft gold layer on the semiconductor substrate. In one embodiment, the apparatus of the present invention can achieve a deposition rate of about one micron thickness in about 20–30 seconds. For example, in this embodiment, depositing a 60-micron gold layer on a SIMM board would take between about 2 and 3 minutes.

The present invention is also useful for electrophoretic deposition, such as discussed in U.S. Pat. No. 3,714,011 issued Jan. 30, 1973 to Grosso et al. (electrophoretic deposition of cathodoluminescent material) and U.S. Pat. No. 4,592,816 issued Jun. 3, 1986 to Emmons et al. (electrophoretically depositing a photosensitive polymer composition on a conductive substrate), photoresist deposition, cleaning/polishing surfaces, or etching surfaces, such as discussed in U.S. Pat. No. 5,096,550 issued Mar. 17, 1992 to Mayer et al. In the cleaning/polishing and etching of semiconductor substrates, the solution in which the semiconductor substrates are immersed may react in the presence of the electrical current and heat to activate an electrochemical reaction on the semiconductor substrate for cleaning or etching. Of course, with cleaning/polishing and etching of a semiconductor, the anode becomes the cathode and vice versa by switching the electrical connectors. In etching, the semiconductor substrate may be etched by any conventional etching techniques, such as masking the semiconductor substrate and inserting the semiconductor substrate into the apparatus for etching down to etch stops on the semiconductor substrate.

The controllable parameters of apparatus of the present invention may be monitored and controlled by a variety of means. The concentration of the reaction material and pH level in the reaction solution may be monitored by sensors and controlled by adding additional reaction material and/or acid/base to maintain said concentration and PH levels, respectively. The temperature of the reaction solution may be monitored and adjusted with a heat or cooling source within or adjacent to the reaction solution. The flux path between the anode and the cathode may be monitored and adjusted by varying the voltage from the power supply to the anode and the cathode. Also, electrically conductive surfaces to be plated can be tied together electrically to enable coating to be achieved on the various patterns that are otherwise isolated and would require an individual electrical bias.

The apparatus and method of the present invention achieves a highly uniform thickness and composition of deposition material on an article by electrodeposition, and may also be used to achieve a uniform etch or polish on an article.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Although the present invention can be used for electrodeposition, electroetching, or electropolishing, the following description focuses on electrodeposition. It is, of course, understood that one skilled in the art can apply the teachings to etching, polishing, or the like.

Figure 1:
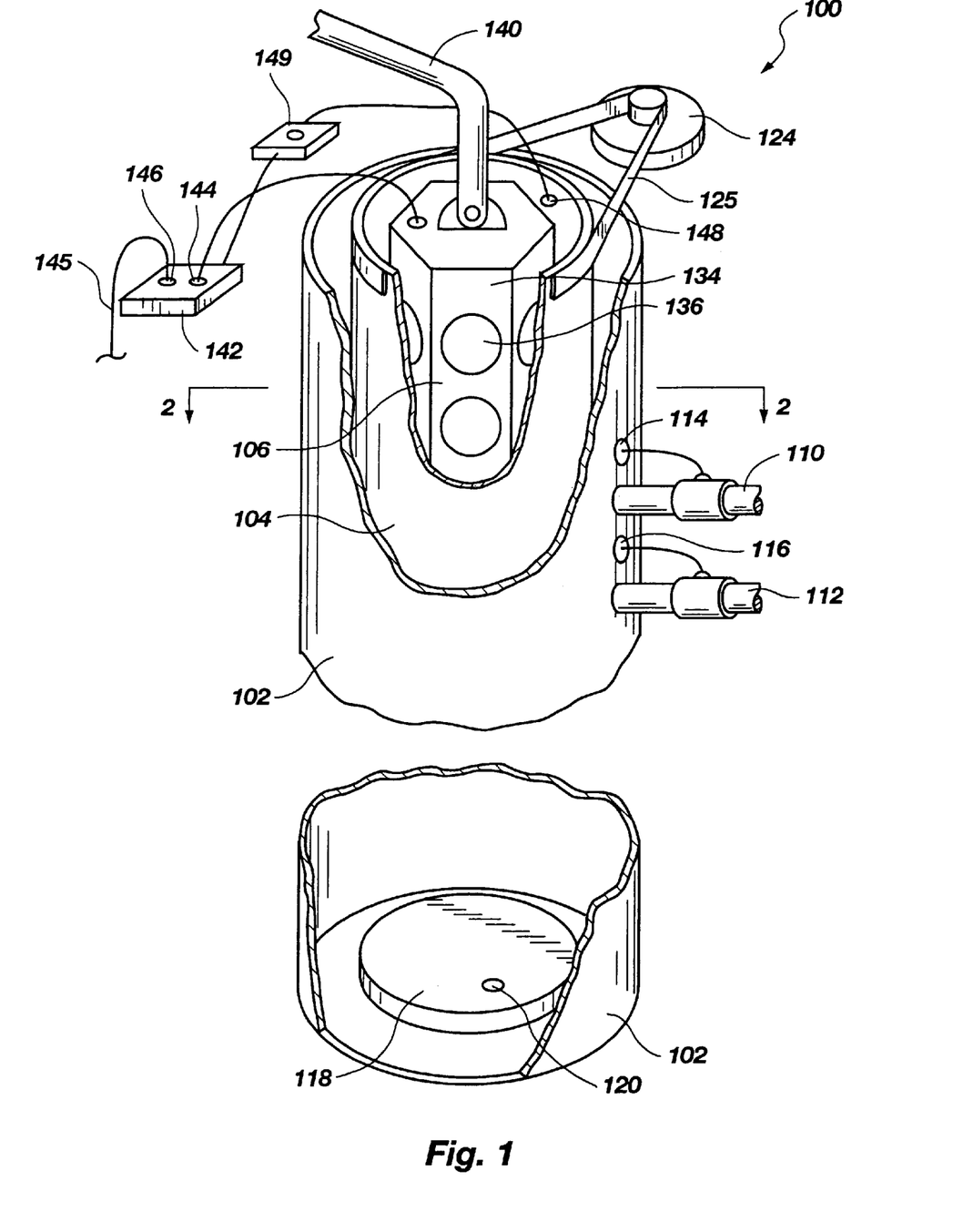
FIG. 1 is an oblique, cut away view of an electrodeposition apparatus of one embodiment of the present invention.
Figure 2:
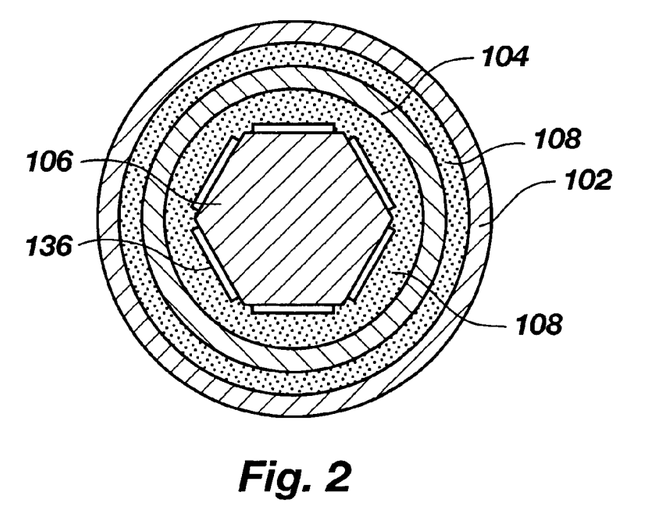
FIG. 2 is a side cross-sectional view of the electrodeposition apparatus of the present invention along line 2—2 of FIG. 1.

FIGS. 1 and 2 illustrate an electrodeposition apparatus 100 according to one embodiment of the present invention. The electrodeposition apparatus 100 comprises a housing tank 102 with a hollow electrode, specifically an anode 104, disposed therein and a second electrode, specifically a cathode 106, disposed within the hollow anode 104.

The housing tank 102 contains a deposition solution 108 in which the hollow anode 104 and the cathode 106 are immersed (see FIG. 2). The housing tank 102 is preferably made from a material which is non-conductive and does not interact with the deposition solution 108, such as poly (methyl-methacrylate) or polypropylene, and preferably can be opened or closed from a top surface.

The housing tank 102 preferably includes at least one deposition solution feed line 110 and at least one acid feed line 112 (or a base feed line depending on the requisite reaction conditions to maintain pH). The deposition solution feed line 110 is preferably connected to at least one deposition solution concentration sensor 1 14 which monitors the concentration of the deposition material (e.g., metal ions) in the deposition solution 108. When the deposition material in the deposition solution 108 becomes depleted below a predetermined deposition material concentration, the deposition solution concentration sensor 114 will activate the solution feed line 110 which is connected to a deposition material rich solution source (not shown) to feed the rich solution into the housing tank 102 to maintain the predetermined deposition material concentration. The acid feed line 112 is preferably connected to at least one pH sensor 116 which monitors the pH of the deposition solution 108. When the pH of the deposition solution 108 varies from a predetermined pH level, the pH sensor 116 will activate the acid feed line 112 which is connected to an acid solution source (not shown) to feed acid into the housing tank 102 to maintain the predetermined pH level. It is, of course, understood that the acid feed line can be a base feed line depending on the conditions which are required to facilitate the electrochemical reaction.

The housing tank 102 preferably has a heat source 118, such as a heat exchanger, electric heating element, or the like, within or adjacent to the deposition solution 108. The heat source 118 is preferably connected to a temperature sensor 120, such as a thermistor or the like, which monitors the temperature of the deposition solution 108. When the temperature of the deposition solution 108 varies from a predetermined temperature level, the temperature sensor 120 will activate the heat source 118 which will heat the deposition solution 108 to maintain the predetermined temperature. Ideally, the temperature sensor 120 should be positioned away from the heat source 118 in order to sense a more accurate temperature representation of the deposition solution 108. It is, of course, understood that the heat source 118 can be a cooling mechanism, depending on the temperate conditions which are required to facilitate the electrochemical reaction.

Figure 3:
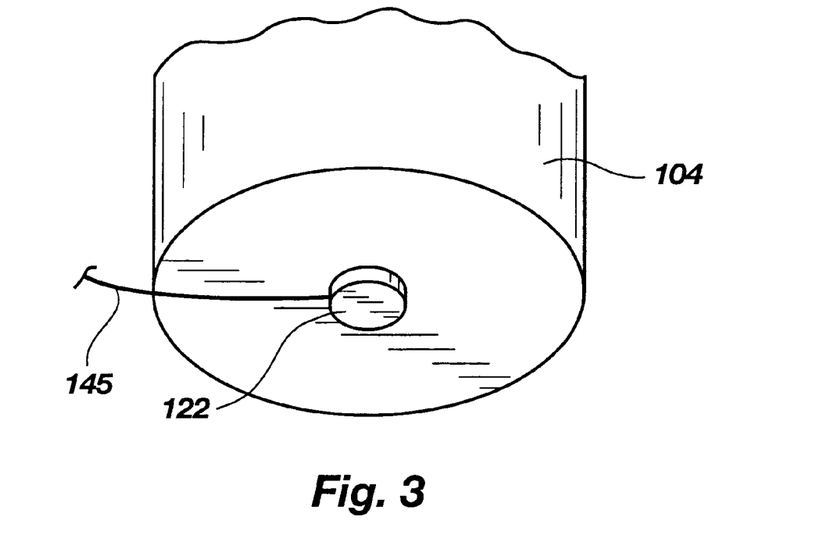
FIG. 3 is a oblique view of the bottom of an anode of the electrodeposition apparatus of FIG. 1 of the present invention.

The hollow anode 104 is preferably a hollow cylinder which is rotatable. The hollow anode 104 preferably pivotally attaches to the bottom (not shown) of the housing tank 102 with a rotating member 122, such as a ball bearing or the like, as shown in FIG. 3. Although it is not shown, the hollow anode's 104 rotation may be stabilized by stabilization means known in the art. Furthermore, although it is not essential to the present invention, the rotating member 122 may comprise spring biased slip rings or have a mercury electrical connection to minimize mechanical friction which, in turn, reduces the likelihood of a static electric discharge. The hollow anode 104 is also electrically isolated from the housing tank 102. The hollow anode 104 is in contact with a rotation mechanism 124, such as a variable speed and direction motor, by gears, pulleys, belts, or the like (shown in FIG. 1 as a belt 125). Thus, via the rotation mechanism 124, the hollow anode 104 can be rotated in clockwise, counter-clockwise, or back and forth arcuate motion ("washing machine" motion). This motion assists in agitating and mixing the deposition solution 108 to maintain a uniform distribution of deposition material within the deposition solution 108. It is, of course, understood that stirring mechanisms (not shown) can be positioned in the housing tank 102 to assist in agitating the deposition solution 108. The rotation of the hollow anode 104 eliminates the necessity of a paddle (as required in most prior art assemblies) to mix the deposition solution 108. The speed of the rotation mechanism 124 is preferably adjustable such that the speed of rotation of the hollow anode 104 can be manually adjusted or controlled by an automatic controller (not shown).

Figure 4:
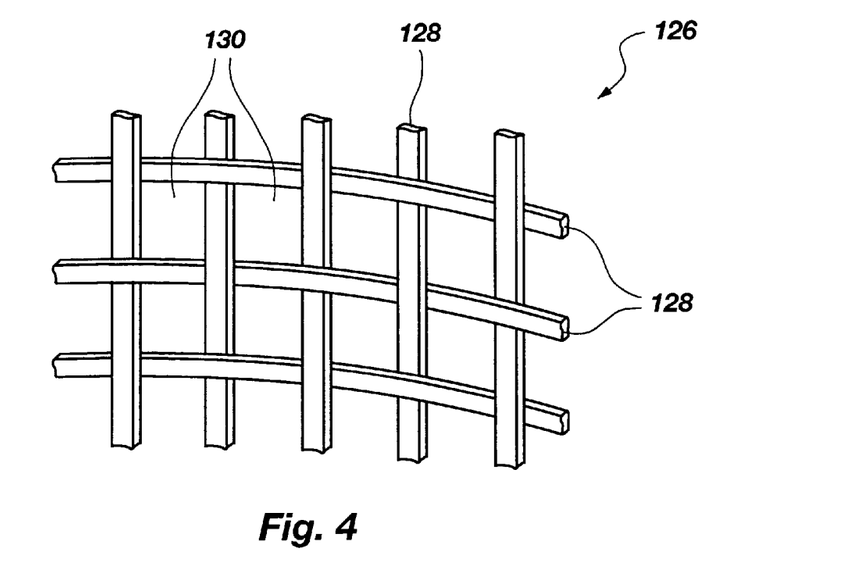
FIG. 4 is an oblique, cut away view of an anode wire mesh embodiment of the present invention.

The hollow anode 104 is preferably fabricated from wire mesh 126, as shown in FIG. 4. In metal deposition, the wire mesh 126 is preferably formed of the same metal as the metal to be deposited on the semiconductor substrate. For example, if copper metal is to be deposited on the semiconductor substrate, then the wire mesh 126 should be made of pure copper or copper with a minor additive, such as 5% phosphorous, to improve grain size control on the semiconductor substrate.

Figure 5:
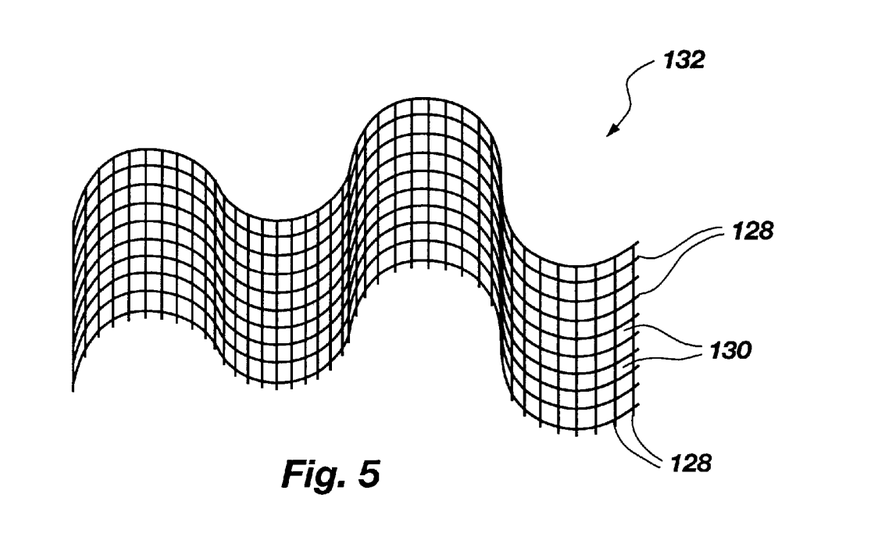
FIG. 5 is an oblique, cut away view of a corrugated anode wire mesh of an embodiment of the present invention.

In an embodiment for coating 6 inch silicon wafers, a square mesh wire 128, preferably 1 mil thick, woven to form square mesh windows 130 (i.e., the open space between the woven wire) of up to ¼ inch per side is preferred. However, it has been found that varying the size of the mesh windows affects the deposition characteristics of the material deposited on the semiconductor substrate. Simple square or circular mesh is preferred. For example, a denser mesh can lead to a higher deposition rate, but allows for less electrolyte solution to pass through the mesh. The anode wire mesh 126 may be formed to have an irregular shape, such as a corrugated shape 132 shown in FIG. 5. The corrugations preferably run parallel with the length of the cathode 106. An irregular shape assists in more effective mixing of the deposition solution 108 during the rotation of the hollow anode 104. However, the irregular shape must not be so substantial that sufficient turbulance is generated during the rotation of the hollow anode 104 to disturb the deposition of material on the substrate 136. Furthermore, sharp protrusions are avoided on the mesh as they can also cause turbulance which can lead to non-uniform deposition.

Figure 6:
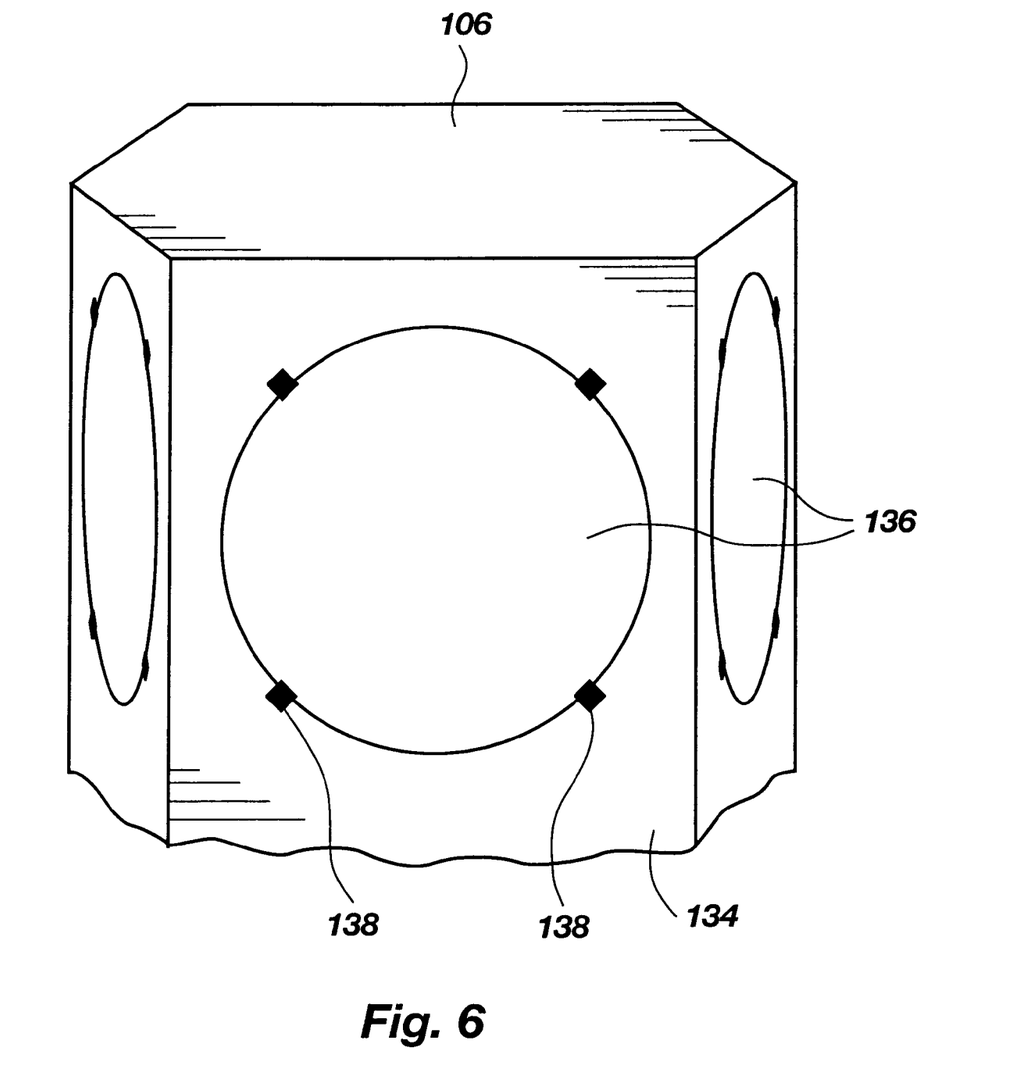
FIG. 6 is an oblique view of one embodiment of the cathode of the present invention.

The cathode 106 is preferably an elongate structure with at least one surface 134 for mounting semiconductor substrates or metal coated substrates 136, as shown in FIG. 6. The substrates 136 are also in electrical communication with the cathode 106 to complete the electrical circuit. The cathode 106 can be of any cross-sectional shape, such as planar, triangular, rectangular, pentagonal, hexagonal (shown in FIGS. 1, 2, 6 and 7), and so on, such that each shape edge forms the cathode surfaces 134 for mounting the semiconductor substrates 136. The cathode surfaces 134 include a plurality of article retainers 138, such as clips, slide on retainer, or the like, for mounting the semiconductor substrates 136. The article retainers 138 could also make electrical contact to the front sides of the semiconductor substrates 136.

Figure 8:
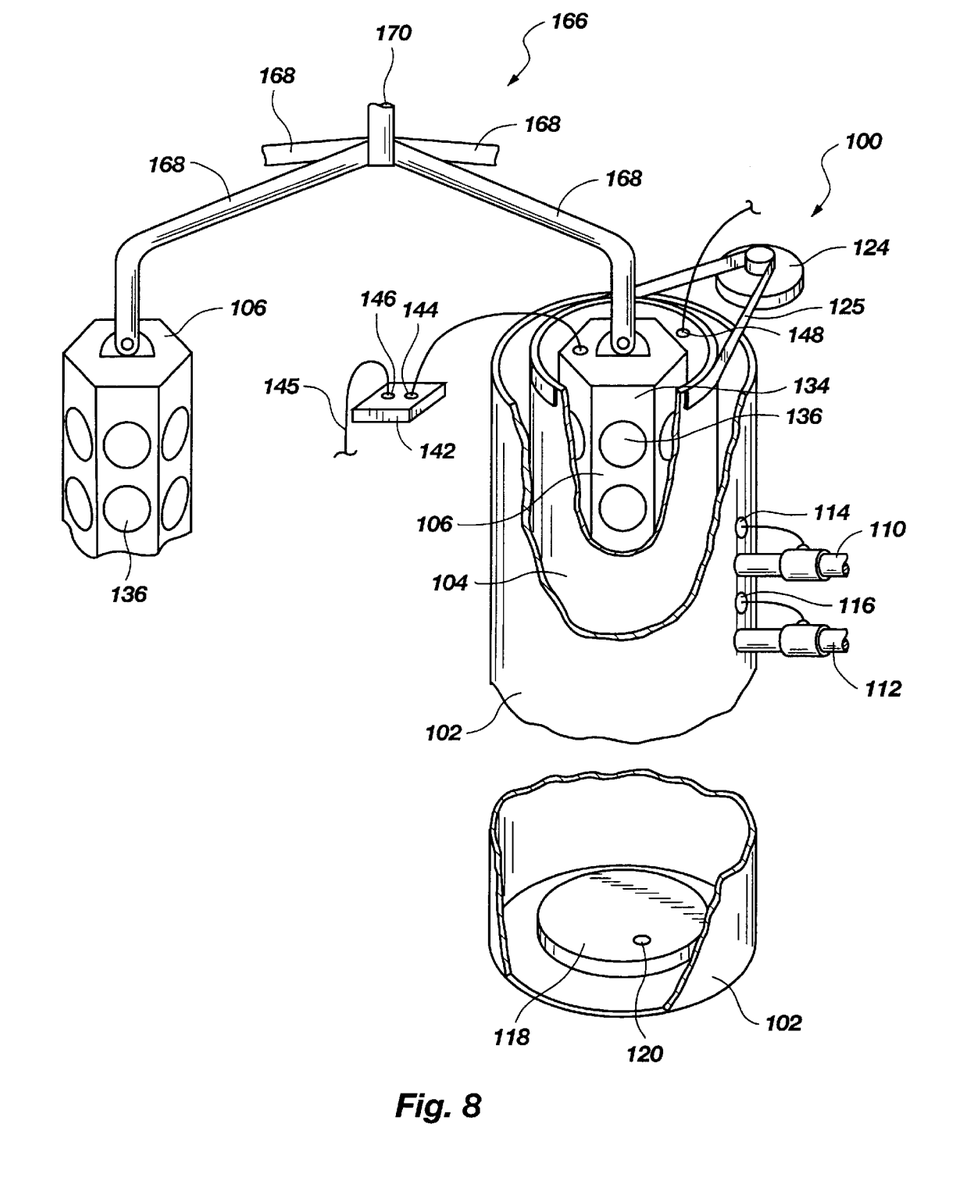
FIG. 8 is an oblique, cut away view of an electrodeposition apparatus of a multiple cathode embodiment of the present invention.

The cathode 106 is preferably connected to an automated immersion mechanism 140. The automated immersion mechanism 140 vertically inserts and extracts the cathode 106 into and from the electrolyte solution 108 in the hollow anode 104 (see FIG. 1). Additionally, the automated immersion mechanism 140 may be arranged in a carousel arrangement, as shown in FIG. 8, such that multiple cathodes 106 are attached to said carousel. The carousel arrangement may be a spider-like arrangement 166 with a plurality of arms 168 extending from a central pivot 170, each terminating in a cathode 106.

Figure 7:
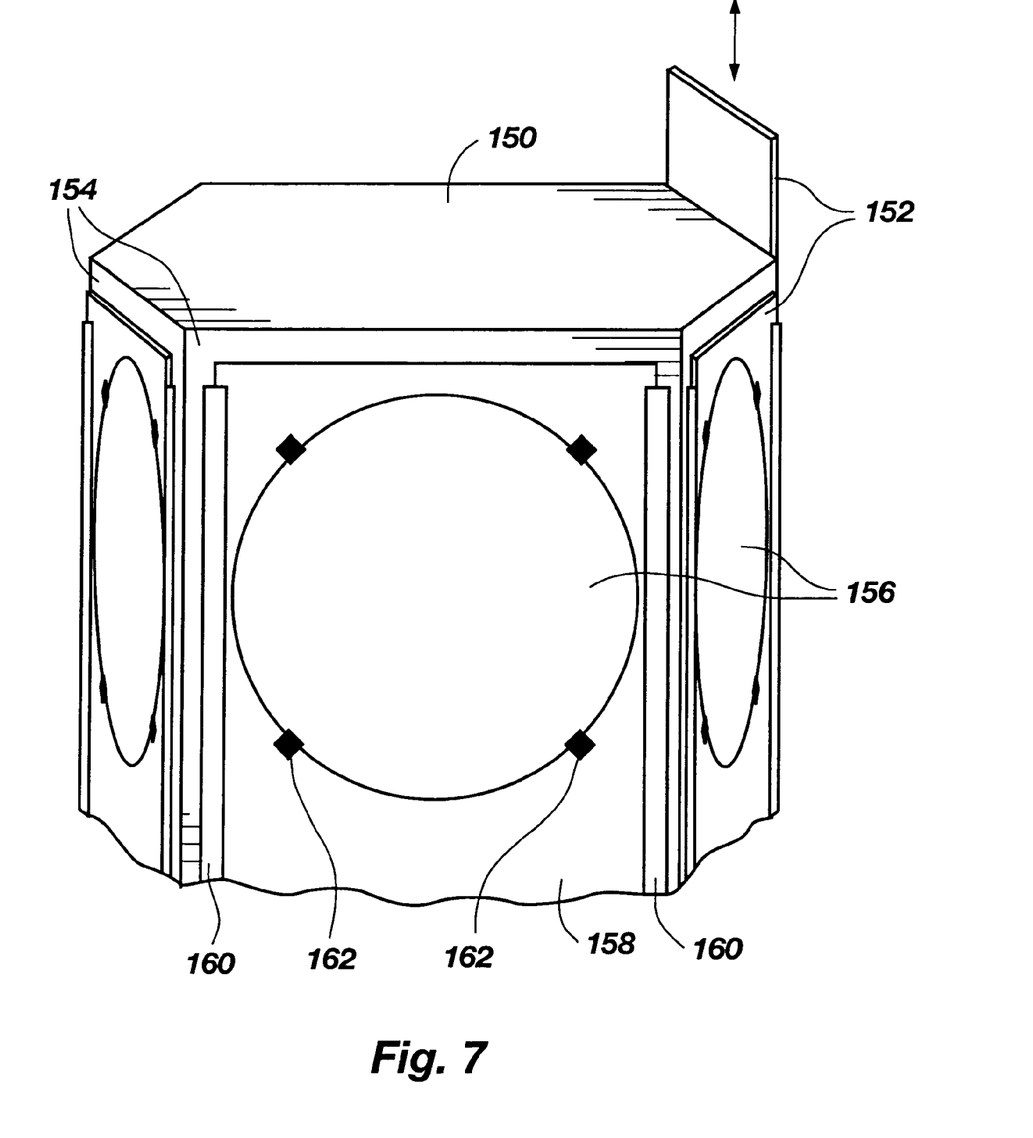
FIG. 7 is an oblique view of another embodiment of the cathode of the present invention.

In an alternative embodiment, a cathode 150 may be stationary wherein at least one removable plate 152 is retained on a cathode surface 154, as shown in FIG. 7. The removable plates 152 each have at least one semiconductor substrate 156 mounted to an external surface 158 of removable plate 152. The removable plates 152 are retained on the cathode surfaces 154 by channel retainers 160. The semiconductor substrates 156 are retained on the removable plates 152 by article retainers 162. The removable plates 152 are inserted and removed after the requisite amount of deposition time manually or by an automated system.

Figure 9:
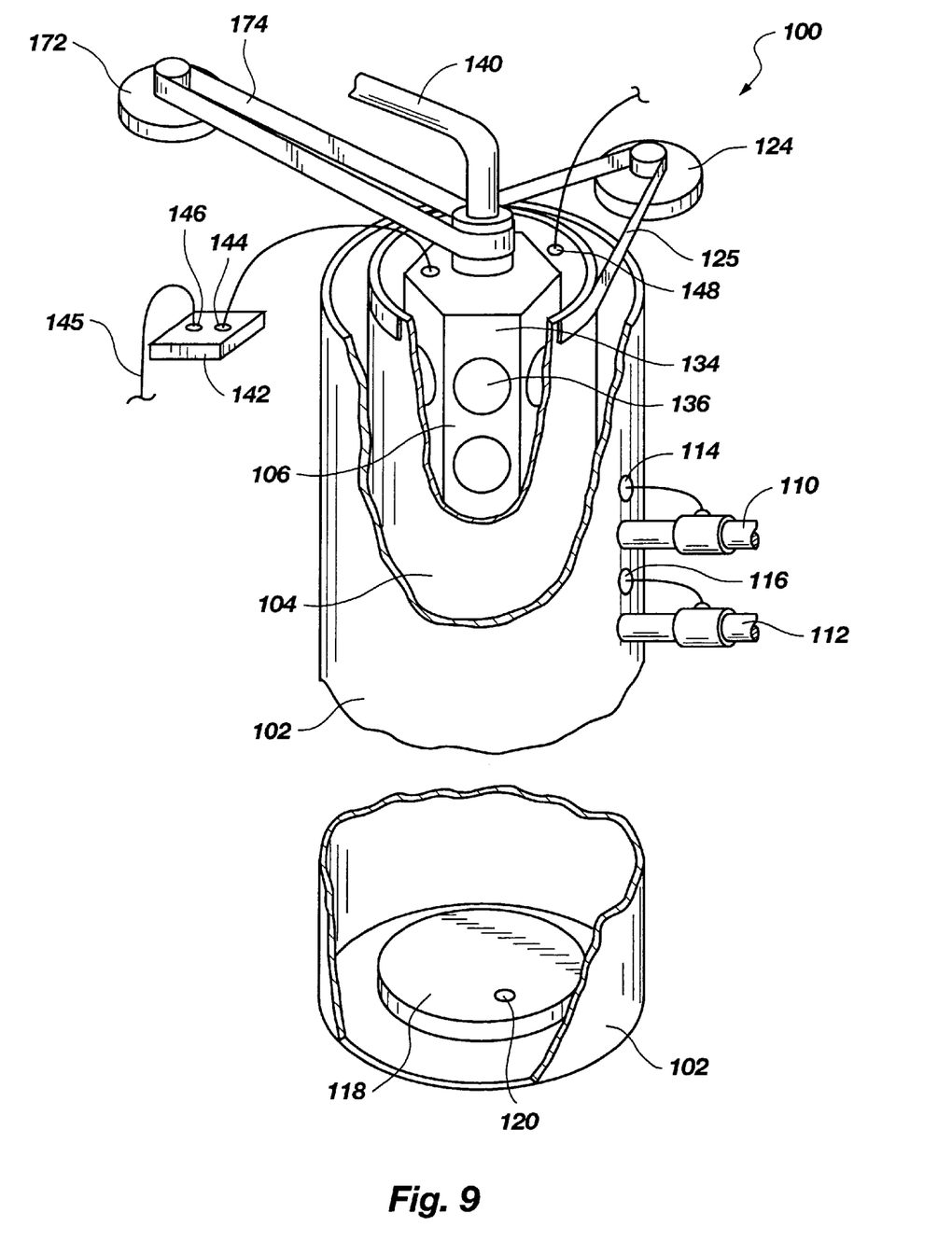
FIG. 9 is an oblique, cut away view of an electrodeposition apparatus of a rotatable cathode embodiment of the present invention.

Although the above-described embodiment rotates the hollow anode 104 about the fixed cathode 106, it is, of course, understood that the cathode 106 could be designed to rotate while the anode 104 remains fixed, or that both the anode 104 and cathode 106 could be designed to rotate either in an opposing or a common direction. This is illustrated in FIG. 9. The cathode 106 is in rotatable contact with a second rotation mechanism 172, such as a variable speed and direction motor, by gears, pulleys, belts, or the like (shown as a belt 174).

As shown in FIGS. 1 and 3, the anode 104 is in electrical communication via wire 145 with a positive terminal 146 of a power supply 142 and the cathode 106 is in electrical communication with a negative terminal 144 of the power supply 142. It is, of course, understood that the polarity of the anode and the cathode can be reversed, depending on the metal ions that are being deposited. Negative ions are typically attracted to positive surfaces and vice versa. At least one flux sensor 148 is preferably placed in the deposition solution 108 between the anode 104 and the cathode 106 to monitor the flux path between the anode 104 and the cathode 106. The flux sensor 148 is connected to a voltage controller 149 which is, in turn, in electrical communication with the power supply 142. The voltage controller 149 controls the voltage from the power supply 142 to the anode 104 and the moving cathode 106 such that the flux path is maintained at a predetermined setpoint.

Depending on the interrelationship of the controllable variables in the system (i.e., temperature, anode rotation speed, pH, voltage, etc.), a control scheme could be used to interrelate the respective variable controllers.

When the apparatus of the present invention is used for cleaning/polishing and etching of semiconductor substrates, the anode generally becomes the cathode and vice versa by switching the electrical connectors. The solution in which the semiconductor substrates are immersed reacts in the presence of the electrical current and heat to activate an electrochemical reaction on the semiconductor substrate for cleaning or etching. In etching, the semiconductor substrate may be etched by any conventional etching techniques, such as masking the semiconductor substrate and inserting the semiconductor substrate into the apparatus for etching down to etch stops on the semiconductor substrate.

It is believed that the present invention achieves uniformity in product by evenly distributing any variance across all of the semiconductor substrates in the reaction solution. The rotation of the anode creates the same flux path across all of the semiconductor substrates as well as mixes the reaction solution. The mixing of the reaction solution evenly distributes any variation in reaction material concentration, temperature, and/or pH of the reaction solution across all of the semiconductor substrates. This mixing is believed to result in a consistent deposition, etch, or polish on all of the semiconductor substrates.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. An apparatus for electrochemical reaction, comprising:
    a hollow first electrode disposed within a chamber;
    a second electrode disposed within said hollow first electrode within said chamber;
    one of said first electrode and said second electrode being configured for removable engagement of at least one semiconductor substrate therewith;
    a rotation mechanism operationally engageable with one of said first electrode and said second electrode to rotate said one of said first electrode and said second electrode with respect to another of said first electrode and said second electode; and
    a power supply configured to provide electricity of a first polarity to one of said first and said second electrodes and to provide electricity of a second polarity to another of said first electrode and said second electrode.

2. The apparatus of claim 1, wherein said chamber is configured for holding a reaction solution.

3. The apparatus of claim 2, wherein said hollow first electrode is an anode and said second electrode is a cathode.

4. The apparatus of claim 2, wherein said hollow first electrode is a cathode and said second electrode is an anode.

5. The apparatus of claim 2, wherein said chamber is configured for holding a reaction solution which includes a deposition material.

6. The apparatus of claim 2, wherein said chamber is configured for holding a reaction solution which includes a conductive deposition material.

7. The apparatus of claim 2, wherein said chamber is configured for holding a reaction solution which includes a metal.

8. The apparatus of claim 2, wherein said chamber is configured for holding a reaction solution which includes metal ions.

9. The apparatus of claim 2, wherein said chamber is configured for holding a reaction solution which includes a photoresist material.

10. The apparatus of claim 2, wherein said chamber is configured for holding a reaction solution which includes an electrophoretic material.

11. The apparatus of claim 2, wherein said chamber is configured for holding a reaction solution which includes an etching material.

12. The apparatus of claim 2, wherein said chamber is configured for holding a reaction solution which includes a polishing material.

13. The apparatus of claim 1, wherein said another of said first electrode and said second electrode is operationally engageable with a second rotation mechanism.

14. The apparatus of claim 1, wherein said hollow first electrode has an irregular surface.

15. The apparatus of claim 1, wherein said hollow first electrode includes a plurality of perforations therethrough.

16. The apparatus of claim 1, wherein said hollow first electrode comprises a wire mesh.

17. The apparatus of claim 16, wherein said wire mesh hollow first electrode has an irregular surface.

18. The apparatus of claim 16, wherein said wire mesh hollow first electrode is corrugated.

19. The apparatus of claim 18, wherein said immersion mechanism is configured to insert and remove multiple electrodes.

20. The apparatus of claim 1, further including a mechanism for inserting and removing one of said first electrode and said second electrode from said chamber.

21. The apparatus of claim 1, further including a plate adapted to removably and electrically engage said at least one second electrode and adapted to removably and electrically engage said at least one semiconductor substrate.

22. The apparatus of claim 2, wherein said chamber comprises:
at least one reaction fluid feed line;
at least one second feed line;
a reaction fluid concentration sensor disposed within said chamber; and
a pH sensor disposed within said chamber.

23. The apparatus of claim 22, further comprising:
said at least one reaction fluid feed line being in communication with and controllable by said reaction fluid concentration sensor; and
said at least one second feed line being in communication with and controllable by said pH sensor.

24. The apparatus of claim 2, further comprising:
a reaction temperature sensor disposed within said chamber; and
at least one reaction solution heat transfer device being in communication with and controllable by said reaction temperature sensor.

25. The apparatus of claim 1, further including a structure adapted to removably and electrically engage said second electrode, said structure further comprising a plurality of surfaces adapted to removably and electrically engage at least one semiconductor substrate on each of said surfaces.

26. The apparatus of claim 25, wherein at least one of said plurality of surfaces comprises a removable plate having article retainers to retain said at least one semiconductor substrate.

27. The apparatus of claim 1, wherein said hollow first electrode is electrically isolated from said chamber so as not to have direct electrical contact with said chamber.

28. The apparatus of claim 1, wherein said chamber is an electrically non-conductive tank.

29. The apparatus of claim 1, further comprising:
a voltage controller being in electrical communication with said power supply; and
at least one flux sensor disposed between said hollow first electrode and said second electrode, said one flux sensor being in electrical communication with said voltage controller.

30. A method of inducing an electrochemical reaction on at least one semiconductor substrate, comprising:
providing a hollow first electrode, and a second electrode;
attaching at least one semiconductor substrate to one of said hollow first electrode and said second electrode;
inserting said second electrode into said hollow first electrode and immersing both electrodes in a reaction solution;
inducing an electrical charge between said hollow first electrode and said second electrode; and
rotating at least one of said hollow first electrode and said second electrode with respect to another of said hollow first electrode and said second electrode.

31. The method of claim 30, wherein said inserting said second electrode into said hollow first electrode comprises inserting said second electrode into an anode and wherein said providing said second electrode comprises providing a cathode.

32. The method of claim 30, wherein said inserting said second electrode into said hollow first electrode comprises inserting said second electrode into a hollow first electrode and further including immersing the first and second electrodes in a reaction solution which includes a deposition material.

33. The method of claim 30, wherein said inserting said second electrode into said hollow first electrode comprises inserting said second electrode into a hollow first electrode and further including immersing the first and second electrodes in a reaction solution which includes a conductive deposition material.

34. The method of claim 30, wherein said inserting said second electrode into said hollow first electrode comprises inserting said second electrode into a hollow first electrode and further including immersing the first and second electrodes in a reaction solution which includes a metal.

35. The method of claim 30, wherein said inserting said second electrode into said hollow first electrode comprises inserting said second electrode into a hollow first electrode and further including immersing the first and second electrodes in a reaction solution which includes metal ions.

36. The method of claim 30, wherein said inserting said second electrode into said hollow first electrode comprises inserting said second electrode into a hollow first electrode and further including immersing the first and second electrodes in a reaction solution which includes a photoresist material.

37. The method of claim 30, wherein said inserting said second electrode into said hollow first electrode comprises inserting said second electrode into a hollow first electrode and further including immersing the first and second electrodes in a reaction solution which includes an electrophoretic material.

38. The method of claim 30, wherein said inserting said second electrode into said hollow first electrode comprises inserting said second electrode into a cathode and wherein said providing said second electrode comprises providing an anode.

39. The method of claim 30, wherein said inserting said second electrode into said hollow first electrode comprises inserting said second electrode into a hollow first electrode and further including immersing the first and second electrodes in a reaction solution which includes an etching material.

40. The method of claim 30, wherein said inserting said second electrode into said hollow first electrode comprises inserting said second electrode into a hollow first electrode and further including immersing the first and second electrodes in a reaction solution which includes a polishing material.

41. The method of claim 30, further including rotating both said first electrode and said second electrode.

42. The method of claim 30, wherein said inserting said second electrode into said hollow first electrode comprises inserting said second electrode into a hollow first electrode having an irregular surface.

43. The method of claim 30, wherein said inserting said second electrode into said hollow first electrode comprises inserting said second electrode into a hollow first electrode having a plurality of perforations therethrough.

44. The method of claim 30, wherein said inserting said second electrode into said hollow first electrode comprises inserting said second electrode into a hollow first electrode comprising a wire mesh.

45. The method of claim 30, wherein said inserting said second electrode into said hollow first electrode comprises inserting said second electrode into a hollow first electrode comprising a wire mesh having an irregular surface.

46. The method of claim 30, wherein said inserting said second electrode into said hollow first electrode comprises inserting said second electrode into a hollow first electrode comprising a wire mesh having a corrugated surface.

47. The method of claim 30, wherein said attaching at least one semiconductor substrate to one of said first and second electrodes comprises removably attaching at least one semiconductor substrate to a plate, wherein said plate removably and electrically engages said one of said first and second electrodes.

48. The method of claim 30, further including providing an immersion mechanism for inserting and removing at least one of said first electrode and said second electrode into and out of said reaction solution, and further comprising removing one of said first electrode and said second electrode from said reaction solution using said immersion mechanism and replacing the removed electrode with another electrode of the same type using said immersion mechanism.

49. The method of claim 30, further comprising monitoring a pH level of said reaction solution and maintaining said pH level within a preselected range.

50. The method of claim 30, further comprising monitoring a temperature of said reaction solution and maintaining said temperature within a preselected range.

51. The method of claim 30, further comprising monitoring a flux between said first hollow electrode and said second electrode and maintaining said flux within a preselected range.

52. The method of claim 30, further comprising monitoring said rotation of said at least one of said hollow first electrode and said second electrode with respect to another and maintaining said rotation within a preselected motion profile.

53. The method of claim 30, further comprising controlling said electrochemical reaction on at least one semiconductor substrate by a control scheme based upon monitoring and manipulating at least one operating variable selected from the group comprising reaction solution temperature, reaction solution pH, electrode rotation direction, electrode rotation speed, electrical current, electrical voltage, and electrical flux.

* * * * *